United States Patent
Nogami et al.

[19]

[11] Patent Number: 6,103,624
[45] Date of Patent: Aug. 15, 2000

[54] METHOD OF IMPROVING CU DAMASCENE INTERCONNECT RELIABILITY BY LASER ANNEAL BEFORE BARRIER POLISH

[75] Inventors: Takeshi Nogami, Kanagawa, Japan; Dirk D. Brown; Sergey Lopatin, both of Santa Clara, Calif.

[73] Assignee: Advanced Micro Devices, Inc., Sunnyvale, Calif.

[21] Appl. No.: 09/293,559

[22] Filed: Apr. 15, 1999

[51] Int. Cl.[7] ...................... H01L 21/441; H01L 21/445; H01L 21/447; H01L 21/428
[52] U.S. Cl. ......................... 438/687; 438/675; 438/678; 438/697; 438/698; 438/707; 438/795; 438/800; 438/257; 438/751; 438/752; 438/762; 438/763
[58] Field of Search .................................. 438/687, 626, 438/627, 628, 629, 631, 632, 675, 678, 697, 707, 795, 800

[56] References Cited

U.S. PATENT DOCUMENTS

| | | | |
|---|---|---|---|
| 5,091,339 | 2/1992 | Carey | 216/18 |
| 5,391,517 | 2/1995 | Gelatos et al. | 438/643 |
| 5,618,752 | 4/1997 | Gaul | 438/626 |
| 5,891,513 | 4/1999 | Dubin et al. | 427/98 |
| 5,913,147 | 6/1999 | Dubin et al. | 438/687 |
| 5,930,669 | 7/1999 | Uzoh | 438/627 |
| 5,969,422 | 10/1999 | Ting et al. | 257/762 |
| 5,989,623 | 11/1999 | Chen et al. | 427/97 |
| 5,990,008 | 11/1999 | Koyama et al. | 438/687 |
| 6,008,117 | 12/1999 | Hong et al. | 438/629 |
| 6,037,258 | 3/2000 | Liu et al. | 438/687 |

FOREIGN PATENT DOCUMENTS

| | | | |
|---|---|---|---|
| 406291191 | 10/1994 | Japan | H01L 21/90 |
| 10135567 | 5/1998 | Japan | H01S 3/18 |
| 10164090 | 2/1999 | Japan | H01L 21/285 |

OTHER PUBLICATIONS

Peter Singer, Editor–in–Chief, Semiconductor International, "Tantalum, Copper and Damascene: The Future of Interconnects", Jun. 1998, 7 pages.

Robert L. Jackson, et al., Solid State Technology, "Processing and Integration of Copper Interconnects", Mar. 1998, 15 pages.

LaRiviere, Grubman & Payne, LLP, Docket No. P873, U.S. application Serial No. 09/208,623, "Method of Reducing Incidence of Stress–Induced Voiding in Semiconductor Interconnect Lines", filed Dec. 8, 1998, 30 pages.

LaRiviere, Grubman & Payne, LLP, Docket No. P874, U.S. application 1 No. 09/208,596, "Method of Reducing Incidence of Stress–Induced Voiding in Semiconductor Interconnect Lines", filed Dec. 8, 1998, 29 pages.

LaRiviere, Grubman & Payne, LLP, Docket No. P875, U.S. application No. 09/209,367, "Method of Reducing Incidence of Stress–Induced Voiding in Semiconductor Interconnect Lines", filed Dec. 8, 1998, 29 pages.

*Primary Examiner*—Tom Thomas
*Assistant Examiner*—Bernard E. Souw
*Attorney, Agent, or Firm*—LaRiviere, Grubman & Payne, LLP

[57] ABSTRACT

Semiconductor devices with copper interconnects wherein a barrier metal layer is applied over the surface of a dielectric layer with a plurality of trenches. The barrier metal layer lines the trenches. A copper layer is placed over the barrier metal layer and fills the trenches. The part of the copper layer that is not inside the trenches is polished away, making sure that the barrier metal layer is not polished away. The copper layer is laser annealed to increase the grain size, remove seams, and provide a better interface bond between the barrier metal layer and the copper layer. The barrier metal layer protects the dielectric layer during the annealing process. The part of the barrier metal layer that is not in the trenches is removed by polishing.

17 Claims, 6 Drawing Sheets

METHOD OF IMPROVING CU DAMASCENE INTERCONNECT RELIABILITY BY LASER ANNEAL BEFORE BARRIER POLISH

FIELD OF THE INVENTION

The present invention relates to semiconductor devices. Even more particularly, the present invention relates to semiconductor devices with copper damascene interconnects.

BACKGROUND OF THE INVENTION

As semiconductor device geometries continue to scale down below 0.25 µm, and approach 0.13 µm minimum feature size, the metal interconnect lines which carry current between devices on a chip begin to dominate the overall circuit speed. In order to enhance interconnect speed and reliability, the semiconductor industry is moving away from blanket deposition and etch of aluminum (AL) based metallizations towards single-damascene and dual-damascene interconnect structures with copper (Cu) based metallizations. Copper is a lower resistivity metal than aluminum, which results in lower RC interconnect delay. Copper has also been shown to have superior electromigration performance over aluminum, but is more difficult to process, primarily because (1) it is more difficult to etch and (2) it acts as a deep level trap in silicon (Si) based devices. The preferred way to process copper interconnects is to (1) etch a trench or via into a dielectric material, (2) deposit the interconnect metallization to fill the trench or via, and then (3) polish the metal back to remove any metal from the field (surface of the wafer). The resulting metal-filled trenches and vias form the electrical interconnect. Forming an interconnect structure by filling a trench or via with metal is known as a damascene process. If a trench and underlying via are filled simultaneously, it is known as a dual-damascene process.

Damascene processes are discussed in "Tantalum, Copper and Damascene: The Future of Interconnects" by Peter Singer, in Semiconductor International, June 1998, and "Processing And Integration of Copper Interconnects" by Robert L. Jackson, Eliot Broadbent, Theodore Cacouris, Alain Harrus, Maximillian Biberger, Evan Patton, and Tom Walsh.

A refractory metal (such as Ti, TiN, Ta, TaN, or WN) is typically deposited prior to the deposition of aluminum or copper based metallizations in damascene processing. This barrier layer prevents copper diffusion into the surrounding dielectric and improves the quality of the metal/dielectric interface.

One of the most important reliability concerns in integrated circuits today is electromigration in the metal interconnects, leading to open circuits or short circuits. Under an applied current, charge carriers in a metal (generally electrons) can impart momentum to the metal atoms in an interconnect, inducing an atomic flux in the direction of the charge carriers. In regions where there is a divergence in the atomic flux, atoms can be depleted to form voids and eventually an open circuit, or atoms can be accumulated to form metal extrusions leading to a short circuit with an adjacent interconnect. Electromigration flux divergences in an interconnect line typically occur (1) at the line end, where a via of a different metal blocks atomic diffusion; (2) due to microstructure variations, which give rise to variations in the effective atomic diffusivity along the interconnect; or (3) due to other geometric or microstructural variations such as blocking precipitates across the line width or fluctuations in the line profile. Copper interconnects theoretically have higher electromigration resistance than aluminum at operating temperatures. This improved electromigration reliability in copper has been observed in controlled experiments, but has been difficult to produce in a production environment.

Three process issues that affect electromigration reliability for copper interconnects, manufactured in a production environment, are listed below:

(1) Damascene structures typically have small metal grains compared to etched metal lines. The small metal grains are a result of the metal being deposited into a constrained via and trench, as opposed to being deposited as a blanket film in the case of etched metal lines. Interconnects with large grains typically show better electromigration reliability because they provide fewer grain boundary diffusion paths during electromigration. Atoms diffuse faster along grain boundaries than through the bulk of the grains.

(2) Damascene interconnects often contain seams that form during the filling process. These seams can act as a fast diffusion path during electromigration.

(3) Copper interconnects tend to form a weaker interface with the barrier and passivation materials than aluminum interconnects. As a result, the interface of a copper interconnect line with the surrounding barrier and dielectric materials can act as a fast diffusion path for electromigration. Aluminum interconnects typically react with the surrounding materials to form a strong, low diffusivity interface.

Copper interconnects manufactured in a production environment typically show electromigration reliability that is much lower than predicted theoretically. In order to effectively use copper interconnects in high reliability devices, a technique must be found to (1) increase the mean time to failure (MTTF), and (2) reduce the standard deviation in the mean time to failure ($\sigma$) during electromigration testing.

BRIEF SUMMARY OF THE INVENTION

It is an object of the invention to improve the reliability of copper interconnects formed in a production environment.

It is another object of the invention to increase grain size, eliminate seams and improve the integrity of copper interfaces and copper interconnects formed in a production environment.

Accordingly, the foregoing objects are accomplished by etching a plurality of trenches and vias in a semiconductor substrate forming a damascene structure. A layer of barrier metal is placed over the substrate surface. Copper is deposited in the trenches and vias. The copper is polished back so that only the copper in the trenches and vias remain, without removing the barrier metal from the surface of the substrate. Laser annealing is applied to the substrate, with the surface of the substrate being protected by the barrier metal and the copper being annealed. The barrier metal is then polished from the surface of the substrate.

Other features of the present invention are disclosed or apparent in the section entitled: "DETAILED DESCRIPTION OF THE INVENTION."

BRIEF DESCRIPTION OF DRAWINGS

For a fuller understanding of the present invention, reference is made to the accompanying drawings wherein.

Figure 1:
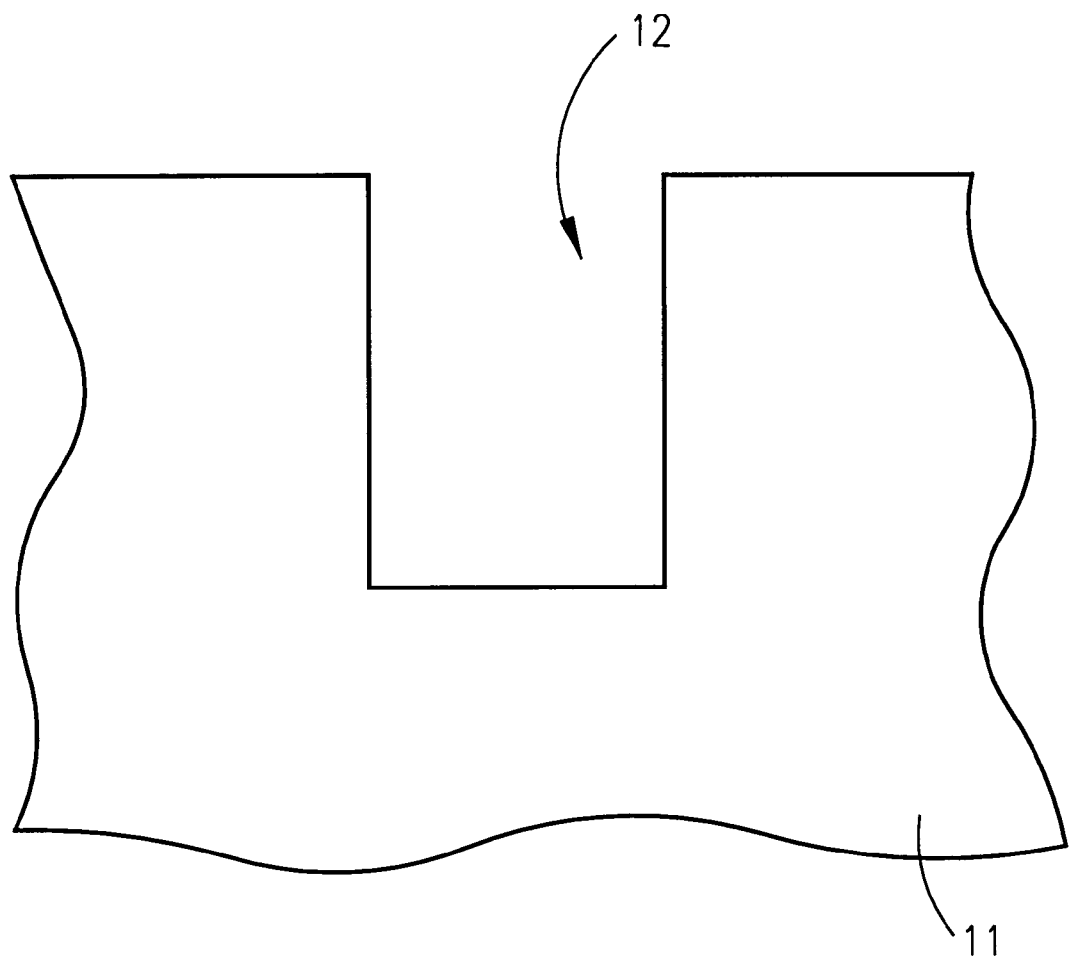
FIG. 1 is a cross sectional view of part of a dielectric layer with a trench.

Reference numbers refer to the same or equivalent parts of the present invention throughout the several figures of the drawing.

DETAILED DESCRIPTION OF THE INVENTION AND BEST MODE OF THE INVENTION

FIG. 1 is a cross sectional view of part of a dielectric layer 11 with a trench 12. In the preferred embodiment, the dielectric layer is a SiO$_2$ layer on a semiconductor wafer. In this embodiment of the invention the trench is formed using a silicon-nitride etch stop/hard mask.

Figure 2:
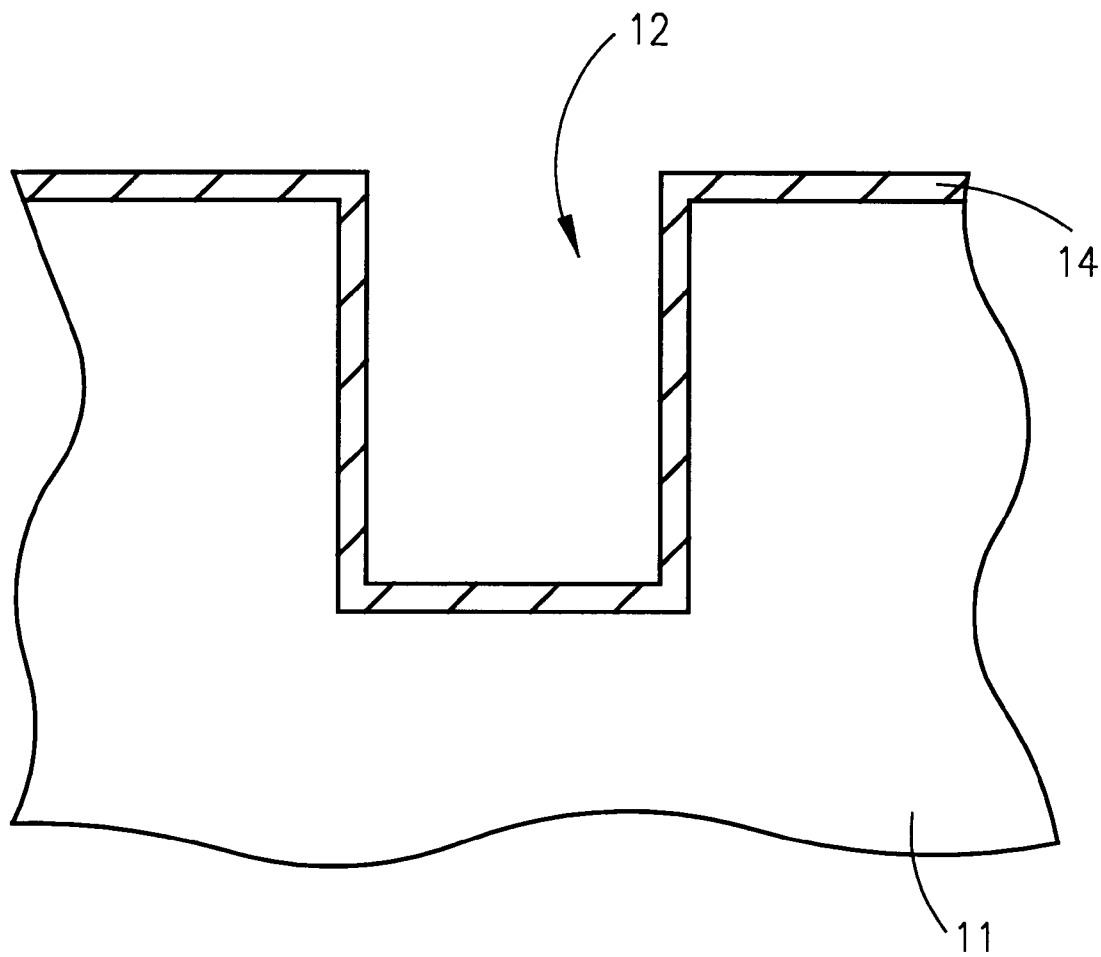
FIG. 2 is a cross sectional view of the part of the dielectric layer shown in FIG. 1, where a barrier metal layer of a refractory metal is deposited over the surface of the dielectric layer.

FIG. 2 is a cross sectional view of the part of the dielectric layer 11 shown in FIG. 1, where a barrier metal layer 14 of a refractory metal is deposited over the surface of the dielectric layer 11, providing a lining along the inside of the trench 12. In the preferred embodiment the barrier metal layer is a refractory metal chosen from the group consisting of Ti, TiN, Ta, TaN or WN. The barrier metal layer may be deposited by a ionized physical vapor deposition (PVD) or chemical vapor deposition (CVD).

Figure 3:
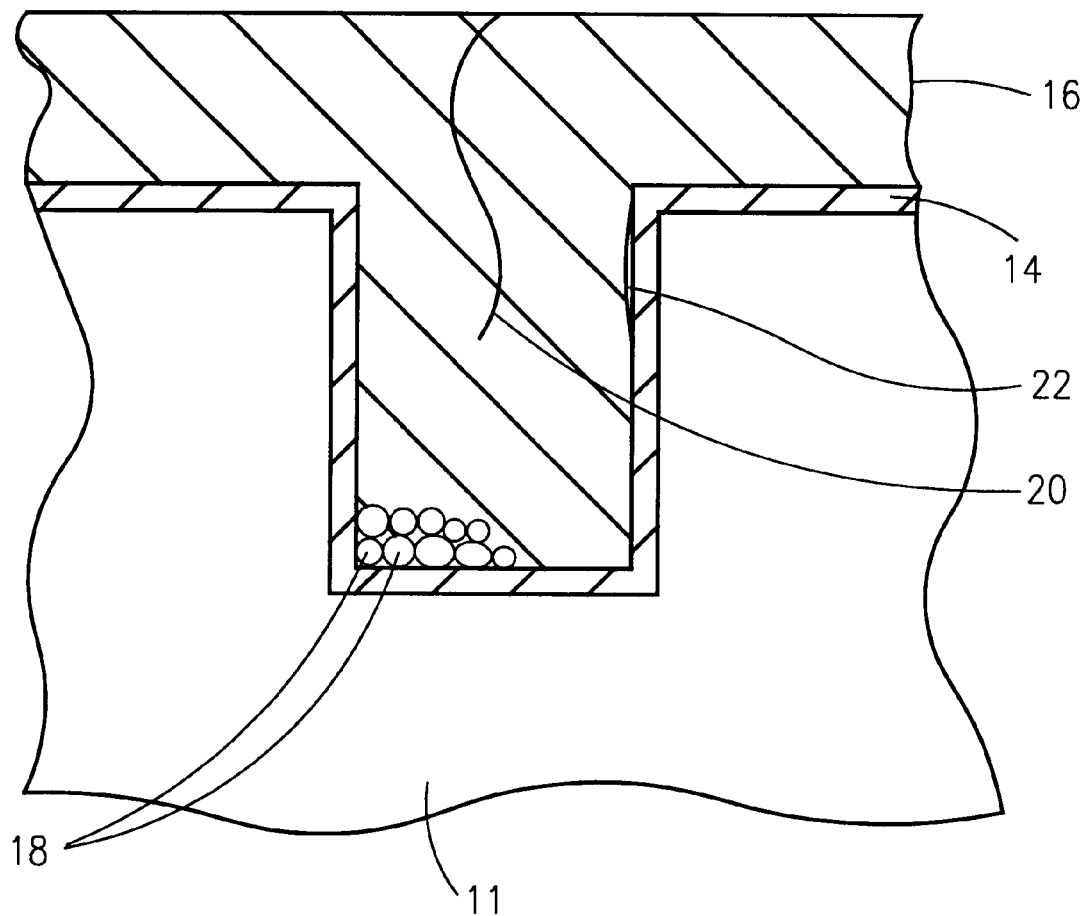
FIG. 3 is a cross sectional view of the part of the dielectric layer shown in FIG. 2, where a copper layer is deposited over the barrier metal layer.

FIG. 3 is a cross sectional view of the part of the dielectric layer 11 shown in FIG. 2, where a copper layer 16 is deposited over the barrier metal layer 14. The copper layer 16 could be deposited in many ways. One way of depositing the copper layer is by using physical vapor deposition to provide a copper seed layer over the barrier metal layer 14. Electroplating is then used to add to the copper seed layer creating the copper layer 16, filling the trench. Small grains 18 are schematically illustrated. The small grains 18 are caused by constrained growth, due to the copper being deposited in a constrained (small) trench, as opposed to being deposited as a blanket film in the case of etched metal lines. A seam 20 is also schematically illustrated. The seam 20 is formed by the creation of the copper layer 16 during the filling process. An unreached weak interface 22 is formed between the copper layer 16 and the barrier metal layer 14. As described in the background of the invention, the small grains 18, seam 20, and the unreached weak interface 22 decrease the electromigration reliability of copper interconnects.

Figure 4:
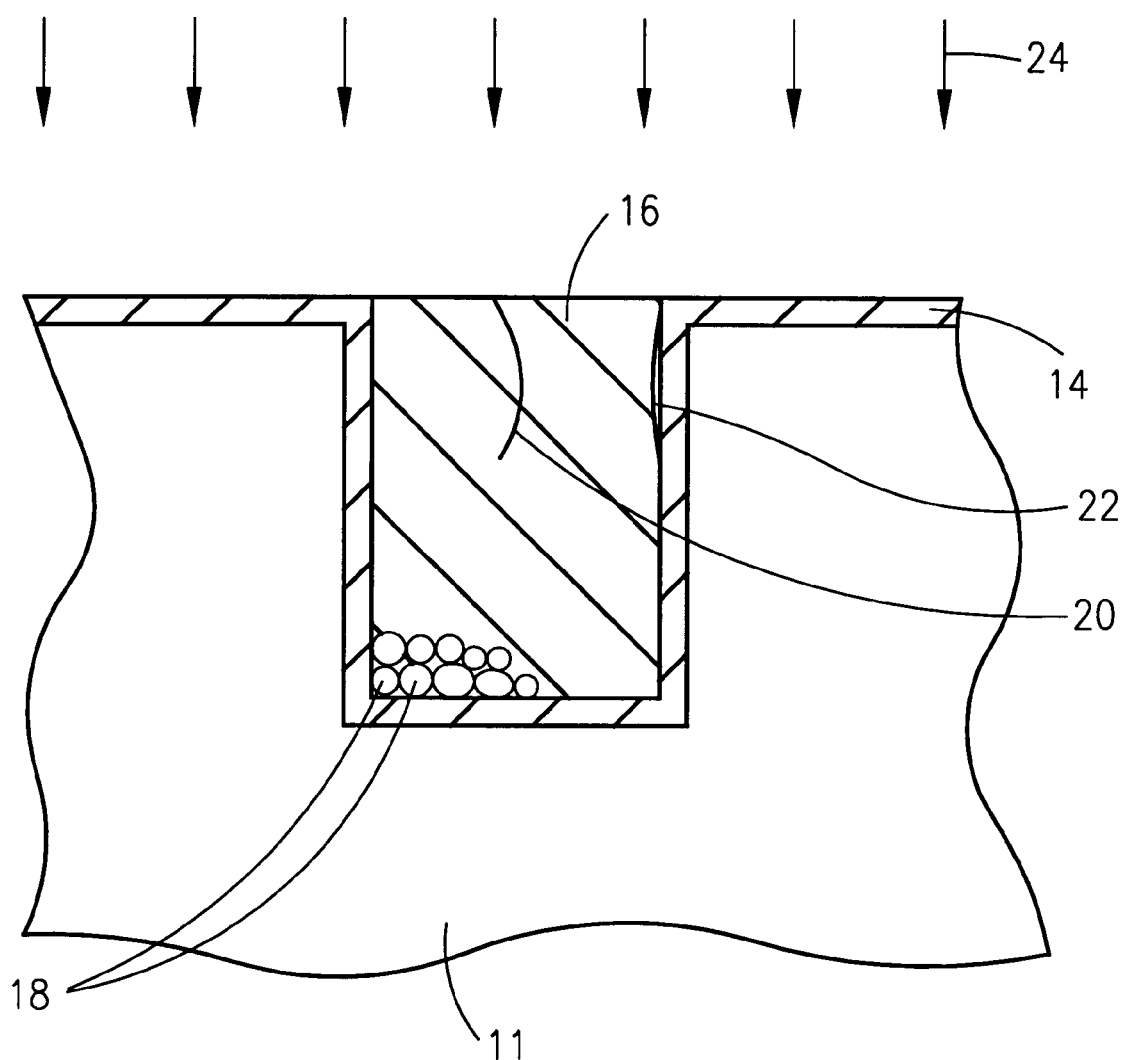
FIG. 4 is a cross sectional view of part of the dielectric layer shown in FIG. 3, where part of the copper layer is removed by polishing.

FIG. 4 is a cross sectional view of part of the dielectric layer 11 shown in FIG. 3, where part of the copper layer 16 is removed by polishing, leaving only the part of the copper layer 16 filling the trench and without removing the barrier metal layer 14 from the surface of the dielectric layer 11 outside of the trenches, as shown. A laser beam 24 is used to laser anneal the remaining part of the copper layer 16. The barrier metal layer 14 protects the dielectric layer 11 during the annealing process.

Figure 5:
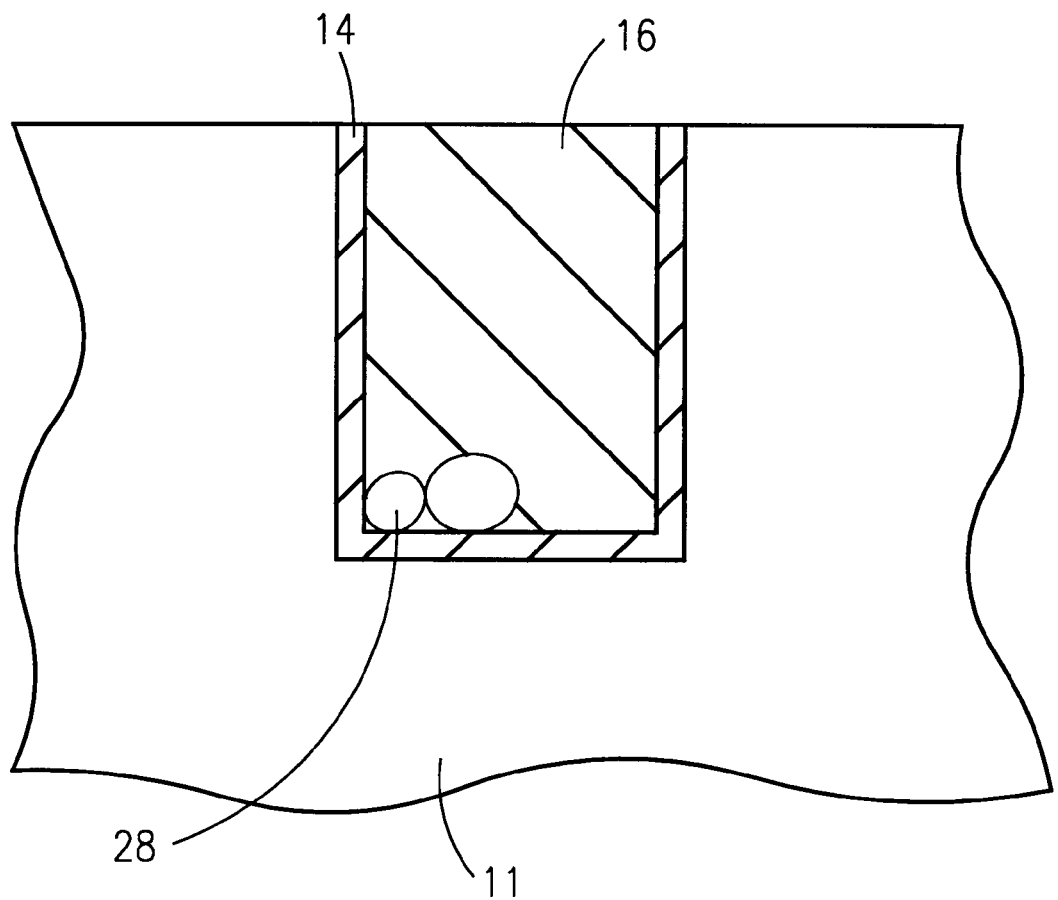
FIG. 5 is a cross sectional view of part of the dielectric layer shown in FIG. 4, after laser annealing.

After the laser annealing, the barrier metal layer 14 on the surface of the dielectric layer 11 is removed, preferably by polishing, leaving only the barrier metal layer 14 in the trench, as shown in FIG. 5. The laser annealing has caused the small grains to form large grains 28, thus increasing the grain size, and has removed the seam and the unreached weak interface, strengthening the interface between the copper layer 16 and the barrier metal layer 14.

Figure 6:
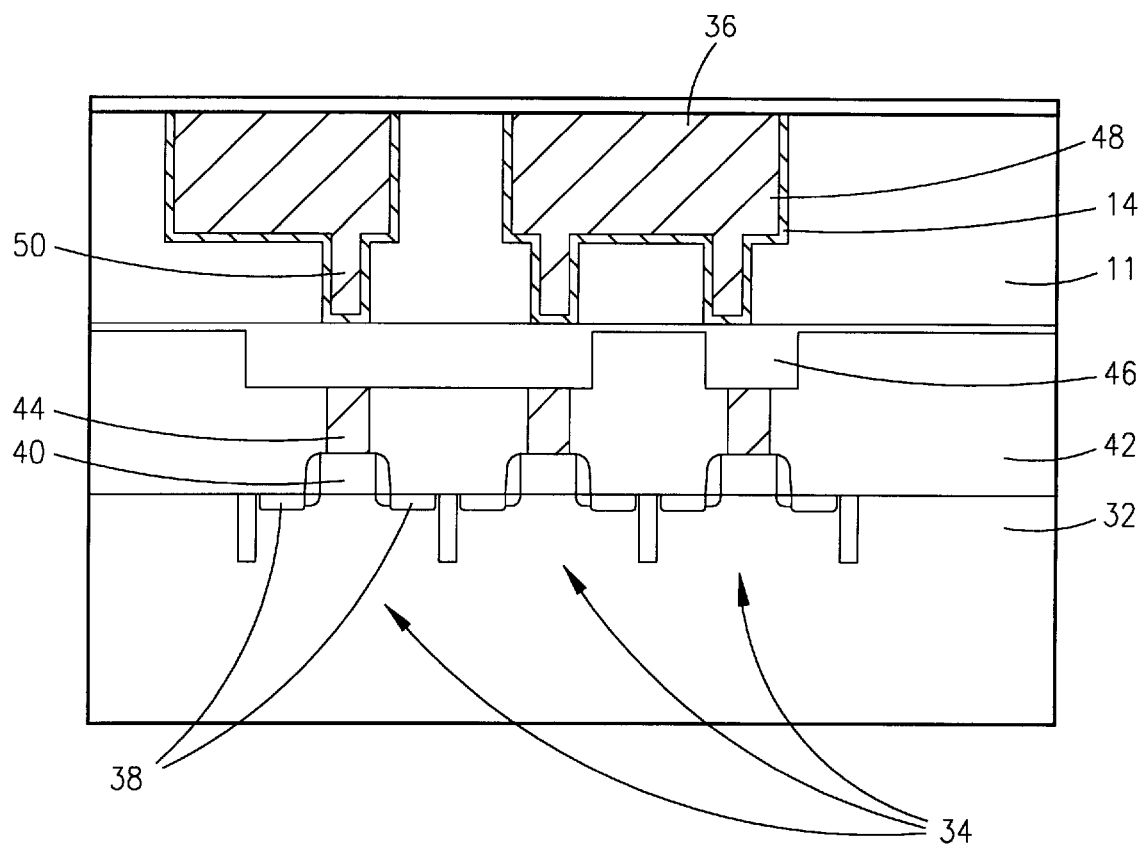
FIG. 6 is a cross sectional view of part of a semiconductor wafer with a plurality of semiconductor devices, which use copper interconnects provided by the invention.

FIG. 6 is a cross sectional view of part of a semiconductor wafer 32 with a plurality of semiconductor devices 34, which use copper interconnects 36 provided by the invention. The semiconductor devices 34 have sources and drains 38 and gates 40. A silicon oxide (SiO$_2$) layer 42 is formed over the surface of the semiconductor wafer 32 and the semiconductor devices 34. A plurality of contacts 44 pass through the silicon oxide layer 42 and are electrically connected to some of the sources and drains 38 and gates 40. The contacts 44 may be tungsten. A silicon nitride layer 46 is formed over the silicon oxide layer 42. The dielectric layer 11 is formed over the silicon nitride layer 46. The dielectric layer 11 is etched to form wide trenches 48 that extend partly through the dielectric layer 11 and narrow vias 50 that extend from a trench 48 to the silicon nitride layer 46. The silicon nitride layer 46 adjacent to a via 50 is thicker so that the silicon nitride layer 46 may act as a stop etch during the etching of the vias 50. As disclosed above, the trenches 48 and vias 50 are lined with a barrier metal layer 14. As disclosed above, the trenches 48 and vias 50 are filled with copper to form the copper interconnects 36.

The trenches and vias may be processed simultaneously in a dual damascene process or the trenches may be processed separately from the vias in a single-damascene process.

In the claims, the term trenches will be used generically to cover both trenches and vias.

The present invention has been particularly shown and described with respect to certain preferred embodiments and features thereof. However, it should be readily apparent to those of ordinary skill in the art that various changes and modifications in form and detail may be made without departing from the spirit and scope of the inventions as set forth in the appended claims. The inventions illustratively disclosed herein may be practiced without any element which is not specifically disclosed herein.

We claim:

1. A method of producing semiconductor device interconnects on a semiconductor wafer, comprising having a plurality of semiconductor devices the steps of:

creating a dielectric layer on the semiconductor wafer;

creating a plurality of trenches in the dielectric layer;

depositing a barrier metal layer on the dielectric layer, so that part of the barrier metal layer is inside of the plurality of trenches and lines the insides of the plurality of trenches in the dielectric layer and part of the barrier metal layer is not inside the plurality of trenches;

depositing a copper layer on the barrier metal layer, so that parts of the copper layer are inside the plurality of trenches and fill the insides of the plurality of trenches in the dielectric layer and parts of the copper layer are not inside the plurality of trenches;

removing that parts of the copper layer that are not inside the plurality of trenches, while leaving the barrier metal layer inside and not inside of the plurality of trenches;

annealing the copper layer; and removing that part of the barrier metal layer that is not inside the plurality of trenches.

2. The method, as recited in claim 1, wherein the step of removing parts of the copper layer comprises the step of polishing the copper layer without removing the barrier metal layer.

3. The method, as recited in claim 2, wherein the step of removing parts of the barrier metal layer comprises the step of polishing the barrier metal layer.

4. The method, as recited in claim 3, wherein the step of depositing a copper layer, comprises the step of:

depositing a copper seed layer over the barrier layer; and electroplating copper onto the copper seed layer.

5. The method, as recited in claim 4, wherein the step of depositing a copper layer causes the creation of grains of copper and seams within the copper layer, and a weak interface between the copper layer and the barrier metal layer.

6. The method, as recited in claim 5, wherein the step of annealing the copper layer causes the grains of copper to form larger grains of copper, removes seams within the copper layer and strengthens the weak interface between the copper layer and the barrier metal layer.

7. The method, as recited in claim 6, wherein the barrier metal layer is made of a refractory metal.

8. The method, as recited in claim 7, further comprising the steps of:

on the semiconductor wafer;

creating a silicon oxide layer over the semiconductor devices and the semiconductor wafer;

creating a silicon nitride layer over the silicon oxide layer, wherein the plurality of semiconductor devices, silicon oxide layer and silicon nitride layer are between the dielectric layer and the semiconductor wafer.

9. The method, as recited in claim 4, further comprising the steps of:

on the semiconductor wafer;

creating an insulating layer over the semiconductor devices and the semiconductor wafer;

creating a stop etch layer over the silicon oxide layer, wherein the plurality of semiconductor devices, insulating layer and stop etch layer are between the dielectric layer and the semiconductor wafer.

10. The method, as recited in claim 4, wherein the barrier metal layer is made of a refractory metal.

11. The method, as recited in claim 4, wherein the step of depositing a copper layer causes the creation of grains of copper.

12. The method, as recited in claim 11, wherein the step of annealing the copper layer causes the grains of copper to form larger grains of copper.

13. The method, as recited in claim 4, wherein the step of depositing a copper layer creates seams within the copper layer.

14. The method, as recited in claim 13, wherein the step of annealing the copper layer removes seams within the copper layer.

15. The method, as recited in claim 4, wherein the step of depositing a copper layer causes a weak interface between the copper layer and the barrier metal layer.

16. The method, as recited in claim 15, wherein the step of annealing the copper layer strengthens the weak interface between the copper layer and the barrier metal layer.

17. The method, as recited in claim 4, wherein the part of the barrier metal layer that is not inside the plurality of trenches covers a surface of the dielectric layer.

* * * * *